US012628669B2

(12) United States Patent
Grujicic et al.

(10) Patent No.: US 12,628,669 B2
(45) Date of Patent: May 12, 2026

(54) THROUGH GLASS VIA WITH A METAL WALL

(71) Applicant: Intel Corporation, Santa Clara, CA (US)

(72) Inventors: Darko Grujicic, Chandler, AZ (US); Sashi S. Kandanur, Phoenix, AZ (US); Helme A. Castro De La Torre, Gilbert, AZ (US); Srinivas V. Pietambaram, Chandler, AZ (US); Marcel Wall, Phoenix, AZ (US); Suddhasattwa Nad, Chandler, AZ (US); Rengarajan Shanmugam, Chandler, AZ (US); Benjamin Duong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 351 days.

(21) Appl. No.: 17/481,242

(22) Filed: Sep. 21, 2021

(65) Prior Publication Data

US 2023/0107096 A1     Apr. 6, 2023

(51) Int. Cl.
| | |
|---|---|
| *H01L 23/498* | (2006.01) |
| *H01L 21/48* | (2006.01) |
| *H01L 23/15* | (2006.01) |
| *H10W 70/05* | (2026.01) |
| *H10W 70/63* | (2026.01) |
| *H10W 70/65* | (2026.01) |
| *H10W 70/66* | (2026.01) |
| *H10W 70/685* | (2026.01) |
| *H10W 70/692* | (2026.01) |

(52) U.S. Cl.
CPC ....... *H10W 70/635* (2026.01); *H10W 70/095* (2026.01); *H10W 70/65* (2026.01); *H10W 70/66* (2026.01); *H10W 70/685* (2026.01); *H10W 70/692* (2026.01)

(58) Field of Classification Search
CPC . H01L 23/49827; H01L 21/486; H01L 23/15; H01L 23/49822; H01L 23/49838; H01L 23/49866
See application file for complete search history.

(56) References Cited

U.S. PATENT DOCUMENTS

| | | | | |
|---|---|---|---|---|
| 2017/0047313 | A1* | 2/2017 | Yang | H01L 23/49811 |
| 2019/0006549 | A1* | 1/2019 | Yim | H01L 25/167 |
| 2019/0239353 | A1* | 8/2019 | Jayaraman | H05K 3/388 |
| 2020/0194384 | A1* | 6/2020 | Chien | H01L 23/49827 |
| 2020/0312767 | A1* | 10/2020 | Pietambaram | H01L 23/481 |

* cited by examiner

*Primary Examiner* — Marlon T Fletcher
*Assistant Examiner* — Samuel Jonathan Smith
(74) *Attorney, Agent, or Firm* — Schwabe, Williamson & Wyatt, P.C.

(57) ABSTRACT

Embodiments described herein may be related to apparatuses, processes, and techniques related to glass layers within a package that include one or more high aspect ratio TGV that are filled with conductive material. The TGV extends from a first side of the glass layer to a second side of the glass layer opposite the first side and are filled with conductive material to provide a high-quality electrical connection between the first side of the glass layer and the second side of the glass layer, where a portion of the wall of the TGV includes titanium. Other embodiments may be described and/or claimed.

25 Claims, 9 Drawing Sheets

CROSS-SECTION OF A - A

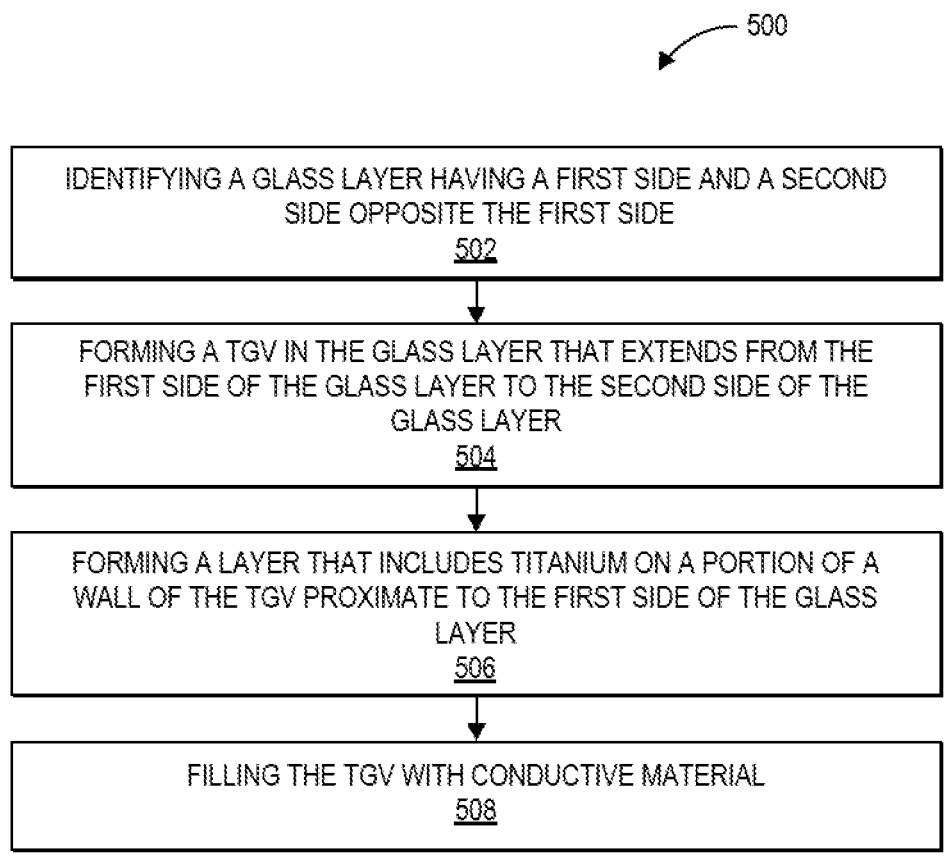

— 500

IDENTIFYING A GLASS LAYER HAVING A FIRST SIDE AND A SECOND SIDE OPPOSITE THE FIRST SIDE
502

FORMING A TGV IN THE GLASS LAYER THAT EXTENDS FROM THE FIRST SIDE OF THE GLASS LAYER TO THE SECOND SIDE OF THE GLASS LAYER
504

FORMING A LAYER THAT INCLUDES TITANIUM ON A PORTION OF A WALL OF THE TGV PROXIMATE TO THE FIRST SIDE OF THE GLASS LAYER
506

FILLING THE TGV WITH CONDUCTIVE MATERIAL
508

FIG. 5

THROUGH GLASS VIA WITH A METAL WALL

FIELD

Embodiments of the present disclosure generally relate to the field of semiconductor packaging, and in particular glass cores with through glass vias (TGV).

BACKGROUND

Continued growth in computing and mobile devices will continue to increase the demand for bandwidth density between components within semiconductor packages.

BRIEF DESCRIPTION OF THE DRAWINGS

FIG. 5 illustrates an example of a process for creating a high aspect ratio TGV that is electrically conductive, in accordance with various embodiments.

DETAILED DESCRIPTION

Figures 1A, 1B:
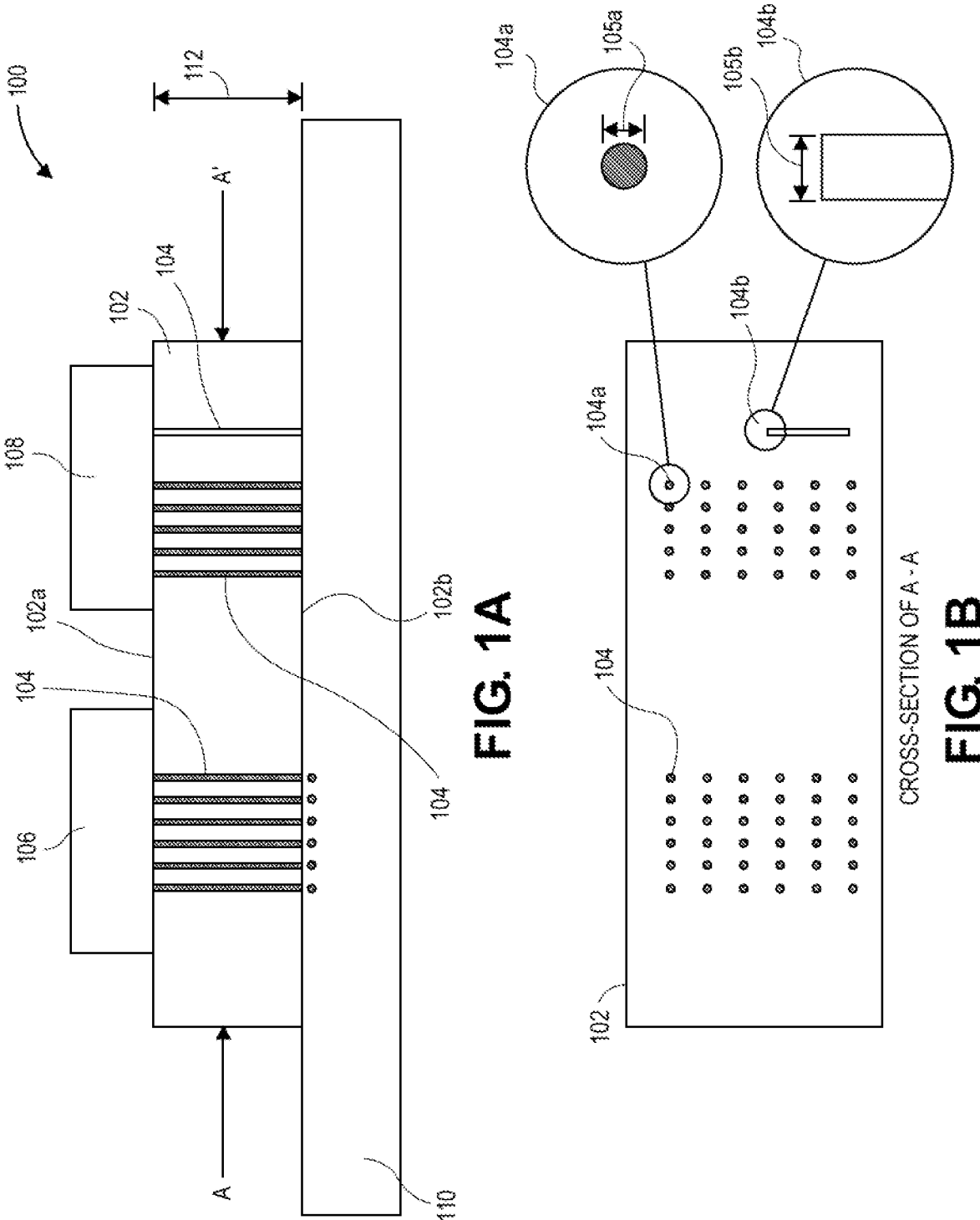
FIGS. 1A-1B illustrate a side view of a package and a top-down view of a glass layer that includes high aspect ratio TGVs to electrically couple a plurality of dies with the substrate, in accordance with various embodiments.

Embodiments described herein may be related to apparatuses, processes, and/or techniques related to manufacturing glass layers that include one or more high aspect ratio TGV that are filled with electrically conductive material. In embodiments, a high aspect ratio TGV extends from a first side of the glass layer to a second side of the glass layer opposite the first side. These TGV include electrically conductive material, which may also be referred to as metallized, to provide a high-quality electrical connection between the first side of the glass layer and the second side of the glass layer. In embodiments, the ratio of a length of the TGV to a diameter of the TGV may be 8 or higher. Embodiments described herein may enable TGV metallization architectures without the need to deposit high aspect ratio seed within the entire TGV, thus enabling TGVs with high aspect ratios to be metallized. In embodiments, the glass layers may also be glass cores within a substrate.

Glass cores may be selected for semiconductor substrate packaging to enable high-frequency signal transmissions between components within the package. For example, central processing unit (CPU) tiles and high-bandwidth memory tiles within a disaggregated CPU architecture may be coupled using multiple TGVs within a glass core bridge. The flatness and stiffness provided by the glass core may enable tighter electrical routings on the glass core or in layers coupled with the glass core. As a result, glass cores provide better coplanarity and rigidity in comparison to organic cores and may resulting in better package performance and reliability over organic cores that may be more uneven and less rigid.

In embodiments, TGVs within the glass core may be filled with conductive material such as copper and may be used to electrically couple interconnects on the front and the back sides of a semiconductor package to transmit electrical signals, including high-frequency electrical signals, through the TGVs. In legacy implementations, during creation of the TGV, placement of the conductive material may be challenging using a conventional metal seeding and subsequent electrolytic plating process of a copper conductor material if the TGV has an aspect ratio that is too high.

In legacy manufacturing processes, copper seed sputtering may be used. As a line of sight process, sputtering can result in limited seed deposition on the TGV walls for high aspect ratio TGVs. This may produce unreliable electrical connections through the TGV as a consequence of higher thin film resistance, or may result in TGVs that have electrical discontinuities. Some legacy implementations attempt to address this deficiency in sputtering by tilting the glass during the copper seed sputtering process. However, with such an approach, it will become increasingly difficult to scale with TGVs with higher aspect ratios.

Embodiments described herein include processes to metalize high aspect ratio TGVs within a glass core. One such process may include partially filling a TGV from a first side of the glass core with a sacrificial material, for example a dry film resist (DFR) to serve as a temporary framework for a one-sided seed sputter, followed by a layer of another metal, such as titanium. After removal of the sacrificial material from the second side of the glass core opposite the first side of glass core, the titanium metal may be etched.

In embodiments, the TGV may be subsequently filled with copper from the second side of glass core using one-sided plating. Another such process may include performing a copper seed sputter on a first side of a glass core to deposit one-sided seed within the TGV, followed by copper plating on the seeded side of the core. The plating would result in two copper lobes forming during the plating process, eventually coming into physical contact and closing the TGV at the first side of the glass core. The TGV may then be filled with copper by plating from the second side the glass core. In embodiments, by applying seed to TGVs on only one side of the glass core, the sputter process is simplified and does not require seeding high aspect ratio TGVs.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1B illustrate a side view of a package and a top-down view of a glass layer that includes high aspect ratio TGVs to electrically couple a plurality of dies with the substrate, in accordance with various embodiments. FIG. 1A shows package 100 that includes a glass substrate 102 with a plurality of TGVs 104 that extend from the first side 102*a* of the glass substrate 102 to the second side 102*b* of the glass substrate 102 opposite the first side 102*a*. In embodiments, the TGVs 104 are filled or partially filled with a conductive material such as copper, which also may be referred to as a metallization, to cause the TGVs 104 to electrically couple the first side 102*a* of the glass substrate 102 with the second side 102*b* of the glass substrate 102.

In embodiments, dies 106, 108 may be electrically coupled with the TGVs 104, and/or physically coupled directly with the first side 102*a* of the glass substrate 102. These dies 106, 108 may be CPU chiplets in a disaggregated CPU architecture. In embodiments, the second side 102*b* of the glass substrate 102 may be coupled with another component 110, which may in embodiments be a high-bandwidth memory 110 or high-speed input/output (HSIO) block.

The glass substrate 102 may have a thickness 112, which may vary from 100 μm to 1800 μm. In embodiments, a thicker glass substrate 102 may be chosen to provide electromagnetic isolation between the dies 106, 108 and the component 110. The thickness of the glass substrate 102 will partially determine the aspect ratio of the TGVs 104. It should be appreciated that the dies 106, 108 and the component 110 may be any number or type of components that may be within a package that may be electrically coupled with the TGVs 104.

In embodiments (not shown) a buildup layer that includes multiple conductive layers separated by dielectric layers for electrical routing, which may also be referred to as a redistribution (RDL) layer, may be placed on the first side 102*a* or the second side 102*b* of the glass substrate 102. The buildup layer or RDL may be electrically coupled with the TGVs 104 and the dies 106, 108 and/or the component 110. In embodiments, the component 110 may be a substrate (not shown) that includes various active and/or passive components. The component 110 may include one or more bridges, such as an open cavity bridge (OCB) or an embedded multi-die interconnect bridge (EMIB).

FIG. 1B shows a top-down view of the glass substrate 102 at cross-section at A-A'. The TGVs 104 may be tightly clustered, depending upon the communication bandwidth required between the dies 106, 108 and the component 110. In embodiments the TGVs 104 may have a cylindrical shape 104*a* with a diameter 105*a*. In embodiments, the TGVs 104 may have a rectangular shape 104*b* with a width of 105*b*. In embodiments, the TGVs may take some other shape (not shown), such as an elliptical shape or other irregular shape.

The aspect ratio of a TGV 104 may be determined by dividing the thickness 112 of the glass substrate 102 by a diameter 105*a* or a width 105*b* of a TGV such as TGV 104*a* or TGV 104*b* respectively. For example, a TGV with a length of 1 mm and a width of 0.1 mm would have an aspect ratio of 10. In legacy implementations, the depth of a sputter, such as a copper sputter, may be deposited into a TGV with an aspect ratio of 4, which would allow the legacy sputter process to fill a TGV that has an aspect ratio of no greater than 8 by sputtering on either side of the glass substrate. However, using embodiments described herein, a TGV 104 with an aspect ratio far larger than 8 may be filled with conductive material, which also may be referred to as being metallized.

Figure 2:
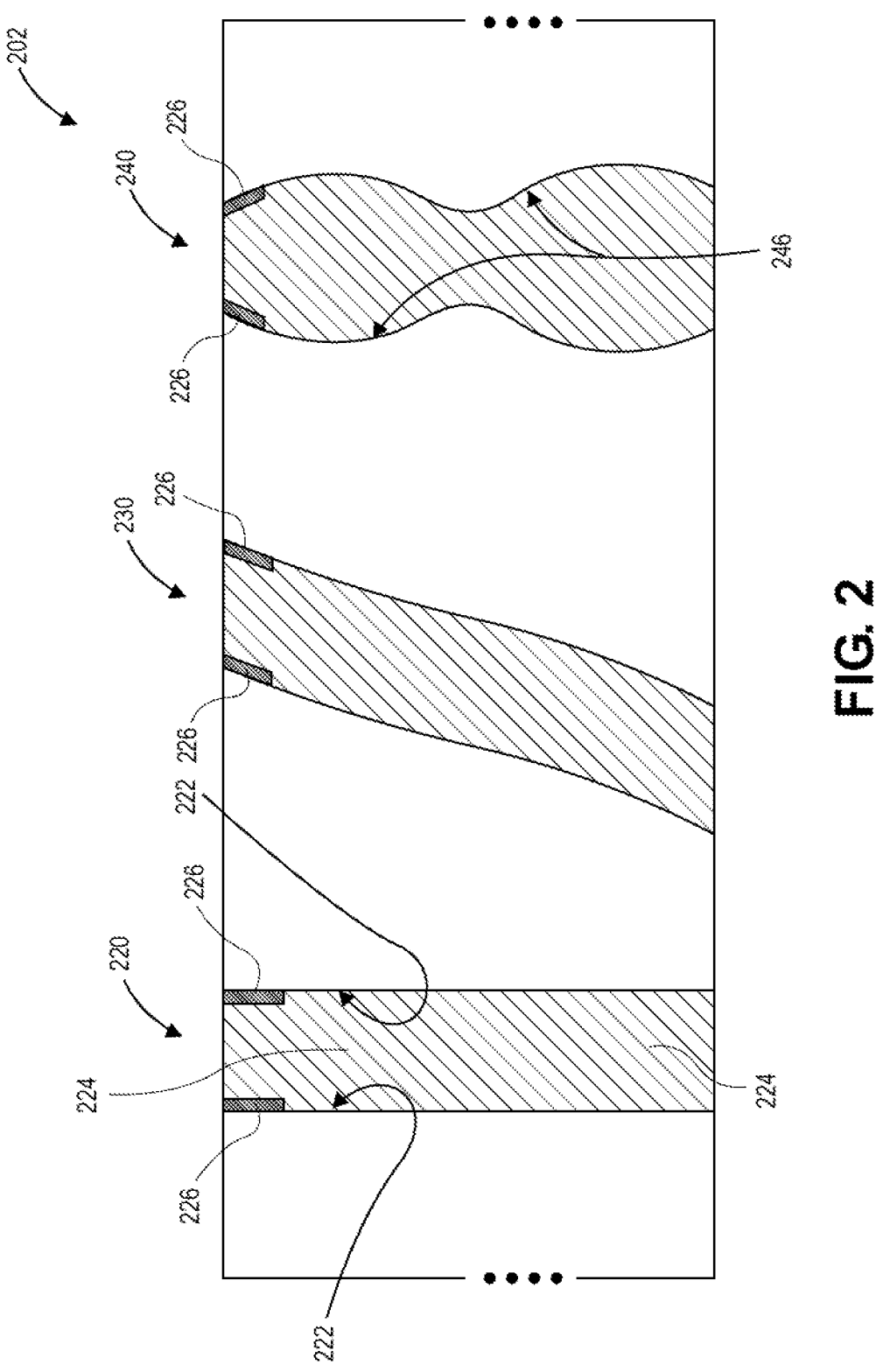
FIG. 2 illustrates a block diagram of a side view of various TGV within glass layer, in accordance with various embodiments.

FIG. 2 illustrates a block diagram of a side view of various TGV within a glass layer, in accordance with various embodiments. Glass substrate 202, which may be similar to glass substrate 102 of FIG. 1A-1B, is shown with various shapes of TGVs. TGV 220 represents a most common type of TGV, with TGV walls 222 that are substantially perpendicular to the top surface of the glass substrate 202. In embodiments, a conductive material 224 may fill the TGV 220 within the walls 222. In embodiments, a material 226 may be attached to a portion of the walls of the TGV 220, proximate to a side of the glass substrate 202. In embodiments, this material 226 may be a metallization that includes titanium. In other embodiments, the material 226 may be a combination of tantalum (Ta), ruthenium (Ru), or copper. Any other suitable metal or a combination of metals may be used that can be deposited onto the glass substrate 202, provided such metals offer electrical conductivity, surface coverage, and/or adhesion properties similar to Ta, Ru, or copper.

TGV 230, 240 show examples of TGVs that may not be orthogonal to a surface of the glass substrate 202. TGV 230 may be formed at an angle other than 90° to the side of substrate 202. TGV 240 may be created with walls 246 that are not straight, but may form an hourglass shape as shown, or may have some other shape. Material 226 may be attached proximate to the side of the substrate 202 as shown, similar to TGV 220.

Figure 3A:
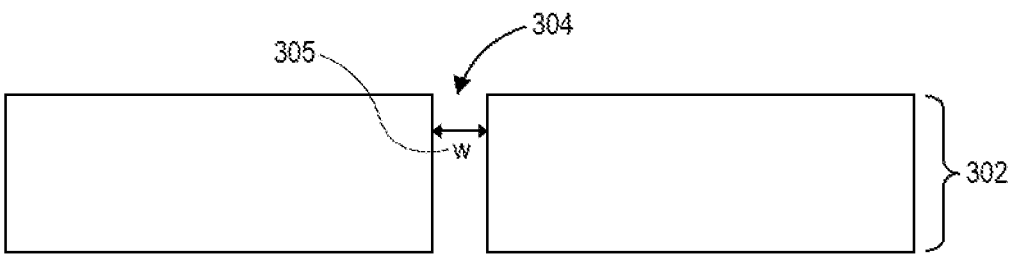
FIGS. 3A-3G illustrate various stages in a manufacturing process to create a high aspect ratio TGV that is electrically conductive, in accordance with various embodiments.

FIGS. 3A-3G illustrate various stages in a manufacturing process to create a high aspect ratio TGV that is electrically conductive, in accordance with various embodiments. FIG. 3A shows a glass layer 302, which may be similar to glass substrate 202 of FIG. 2 or glass substrate 102 of FIG. 1A-1B. A TGV 304, which may be similar to TGV 104 of FIG. 1, may be created in the glass substrate 302. The TGV 304 may be created using the systems, processes, and/or techniques described below with respect to FIG. 6. The TGV 304 may have a width w 305.

Figure 3B:
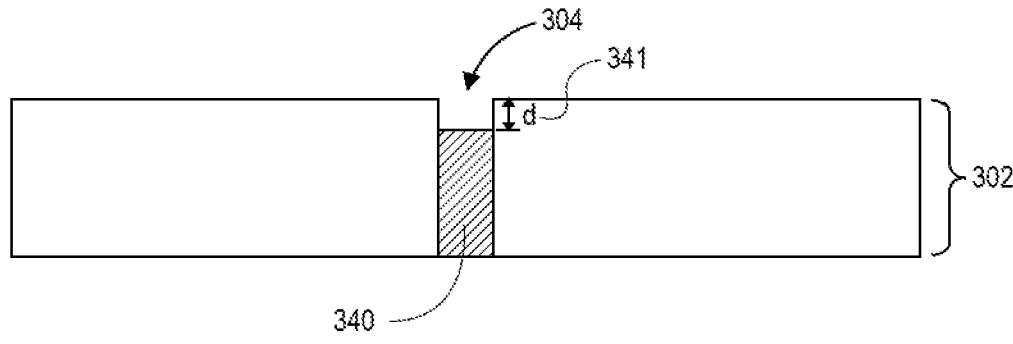

FIG. 3B shows a stage in the manufacturing process where the TGV 304 is partially filled with a filler material 340. In embodiments, the filler material 340 may be referred to as a sacrificial material that is to be removed later in the process. In embodiments, the filler material 340 may be a dry film resist (DFR), a laminated or a liquid dielectric, or some other material that can flow into the via 304 and may be removed later without affecting the seed film of the copper layer 344 of FIG. 3C. The filler material 340 may be inserted within the TGV 304 from either a topside or a bottom side of the glass layer 302. Note that a top of the filler material 340 is positioned at a distance d 341 from a top of the glass layer 302.

Figure 3C:
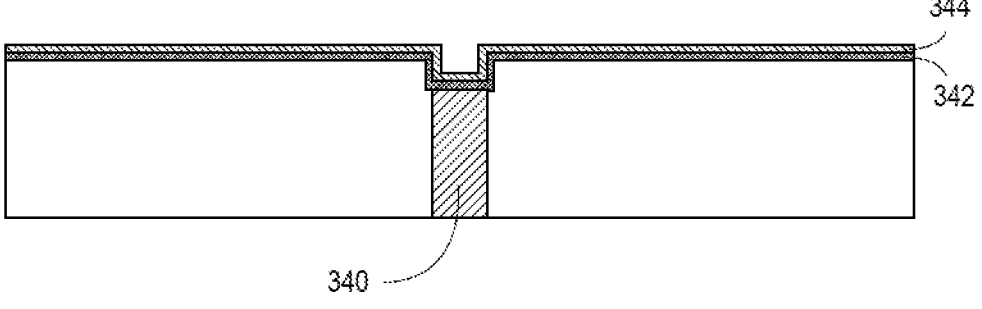

FIG. 3C shows a stage in the manufacturing process where a titanium layer 342 is deposited on the glass layer 302 and on a top of the filler material 340. A copper layer 344, which may be referred to as a seed film, may then be deposited on top of the titanium layer 342. In embodiments, the deposition of the titanium layer 342 and/or the copper layer 344 may be performed using a sputter technique. Note that the sputtering technique may be used providing the width w 305 and the distance d 341 have an aspect ratio that will allow the titanium layer 342 and the copper layer 344 to be uniformly spread within the TGV 304 above the filler material 340.

In embodiments, the titanium layer 342 and the copper layer 344 may also be referred to as films. The thickness of the titanium layer 342 and/or the copper layer 344 may be adjusted based upon the sheet resistance needs for plating, the ease of removal after the via fill of FIG. 3E, or some other manufacturing consideration.

Figure 3D:
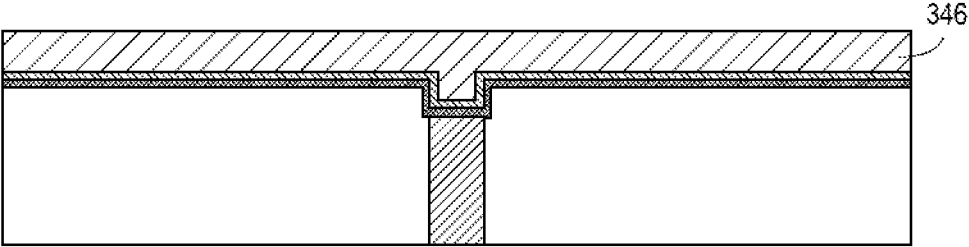

FIG. 3D shows a stage in the manufacturing process where a conductive material 346 is plated on top of the copper layer 344. In embodiments, the conductive material 346 may include copper or some other conductive element. In embodiments, the conductive material 346 may be plated using legacy electrolytic plating techniques.

Figure 3E:
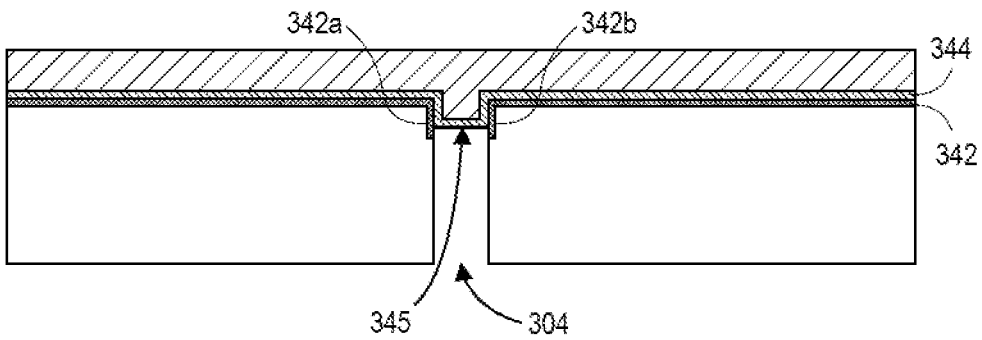

FIG. 3E shows a stage in the manufacturing process where the filler material 340, as well as a portion of the titanium layer 342 is etched. In embodiments, this etching may be performed using a wet etch or a dry etch process. In embodiments, the copper seed portion 345 of the copper layer 344 may be exposed. Note that portions of the titanium layer 342*a*, 342*b* will remain attached to the wall of the TGV 304.

Figure 3F:
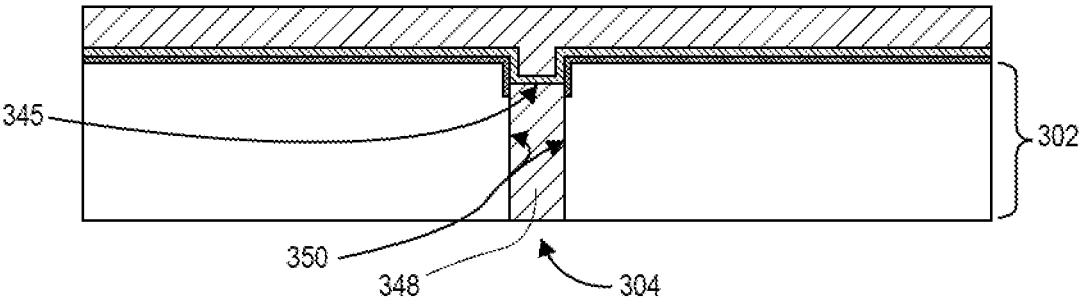

FIG. 3F is a stage in the manufacturing process where copper 348 is grown using the copper seed portion 345 to fill the remainder of the TGV 304. In embodiments, the copper 348 may be grown using electroplating with a bottom-up fill from the bottom side of the glass substrate 302. Note that with this process, depositing a seed material may not be required on the edges 350 of the TGV 304.

Figure 3G:
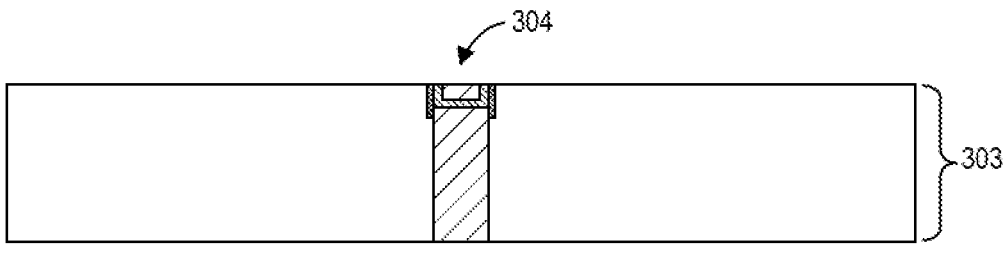

FIG. 3G is a stage in the manufacturing process where the glass substrate 303, which may be similar to glass substrate

302, that includes TSV 304 completely filled with conductive material, is produced by etching or planing the top surface of the glass substrate 302 to remove the conductive material 346, the copper layer 344, and the titanium layer 342.

Figure 4A:
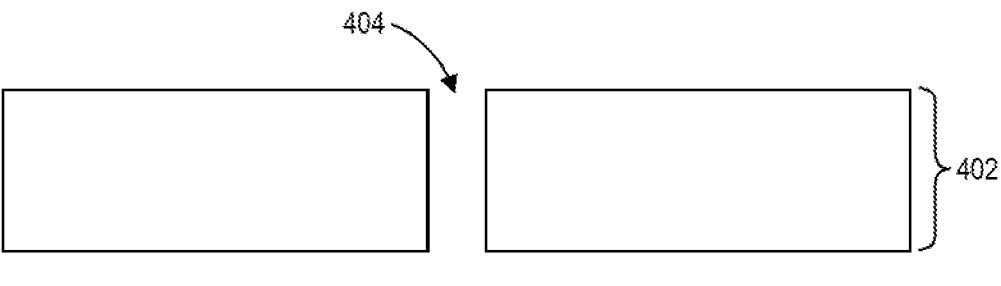
FIGS. 4A-4F illustrate various stages in another manufacturing process to create a high aspect ratio TGV that is electrically conductive, in accordance with various embodiments.

FIGS. 4A-4F illustrate various stages in another manufacturing process to create a high aspect ratio TGV that is electrically conductive, in accordance with various embodiments. FIG. 4A shows a glass layer 402, which may be similar to glass substrate 202 of FIG. 2 or glass substrate 102 of FIG. 1A-1B. A TGV 404, which may be similar to TGV 104 of FIG. 1, may be created in the glass substrate 402. The TGV 404 may be created using the systems, processes, and/or techniques described below with respect to FIG. 6.

Figure 4B:
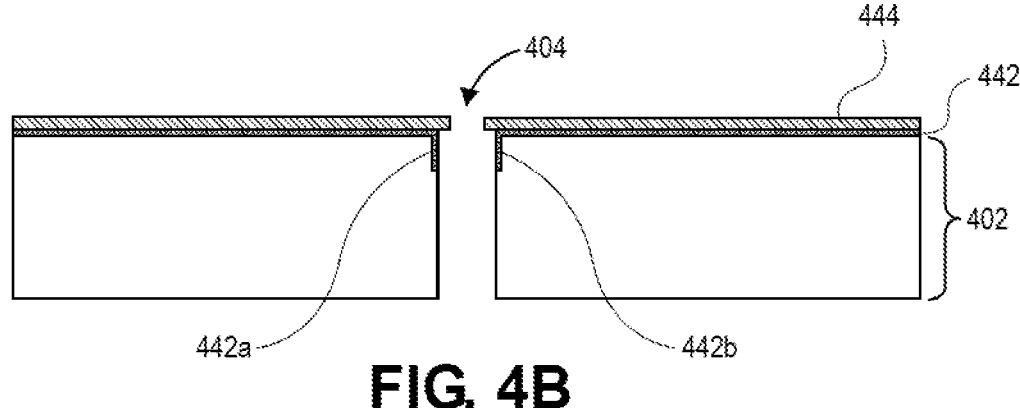

FIG. 4B is a stage in the manufacturing process where a titanium layer 442 is deposited on a side of the glass layer 402 and into portion of the TGV 404. The titanium layer 442 may also be referred to as a titanium film, and may serve as an adhesion layer between the glass layer 402 and copper as described below. Without this adhesion layer, the copper would peel off of the glass layer 402. Note that a portion of the titanium layer 442*a*, 442*b* is deposited within the walls of the TGV 404. In addition, a copper seed layer 444 may be deposited on top of the titanium layer 442. The copper seed layer 444 may also be referred to as a copper film layer. In embodiments, the deposition process for the titanium layer 442, or the copper seed layer 444 may include a plasma vapor deposition process. Note that the deposition process may leave some copper on the wall of the TGV 404, as shown by 442*a* and 442*b*, but not enough to metallize the entire wall of the TGV 404.

Figure 4C:
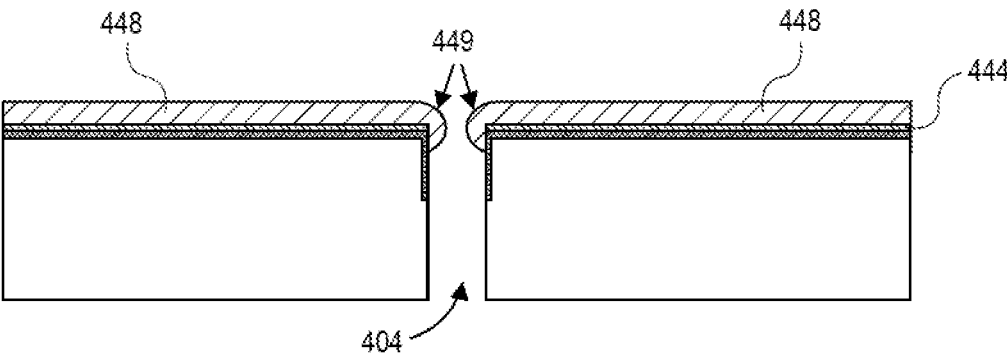

FIG. 4C is a stage in the manufacturing process where copper 448 is electroplated onto the copper seed layer 444. Note that during the electroplating process, overhangs of copper 449 will begin to form around the opening of the TGV 404.

Figure 4D:
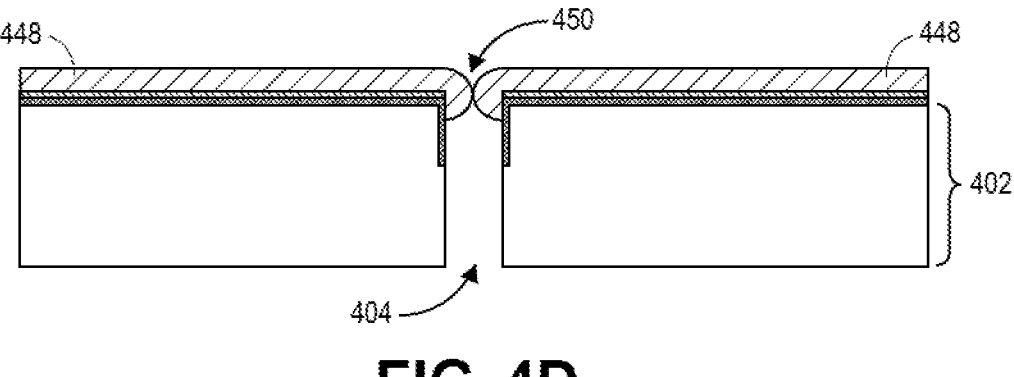

FIG. 4D is a stage in the manufacturing process where the overhangs of copper 449 of FIG. 4C form a copper bridge 450 and closes the TGV 404 at the top side of the glass substrate 402.

Figure 4E:
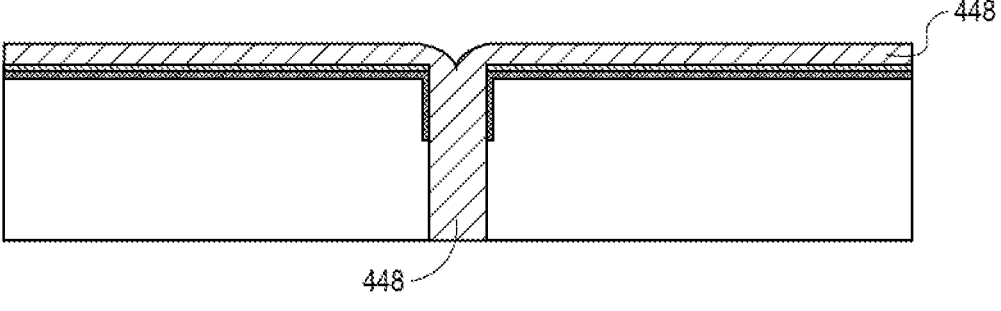

FIG. 4E is a stage of the manufacturing process where copper 448 is grown to fill the TGV 404. In embodiments, the copper fill 448 is grown using electroplating process, filling copper from the copper 448.

Figure 4F:
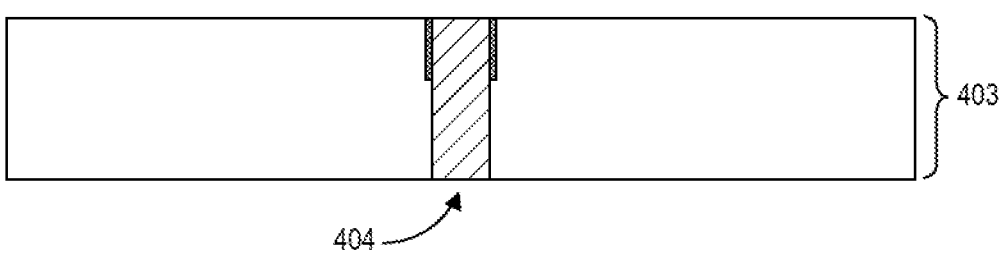

FIG. 4F is a stage of the manufacturing process where the glass substrate 403, which may be similar to glass substrate 402, includes TSV 404 that is completely filled with copper (or other conductive material), is produced by etching or planing either or both of the surfaces of the glass substrate 402 to remove the copper 448, the copper layer 444, and/or a portion of the copper fill 448.

FIG. 5 illustrates an example of a process for creating a high aspect ratio TGV that is electrically conductive, in accordance with various embodiments. Process 500 may be implemented using the systems, processes, and/or techniques described herein, and in particular with respect to FIGS. 1-4F.

At block 502, the process may include identifying a glass layer having a first side and a second side opposite the first side. In embodiments, the glass layer may be similar to glass substrate 102 of FIG. 1, glass substrate 202 of FIG. 2, glass substrate 302 of FIGS. 3A-3G, glass substrate 402 of FIG. 4A-4F, or glass wafer 606, 626, 646, 666 of FIG. 6.

At block 504, the process may further include forming a TGV in the glass layer that extends from the first side of the glass layer to the second side of the glass layer. In embodiments, the TGV may be similar to TGV 104 of FIG. 1, TGV

Figure 6:
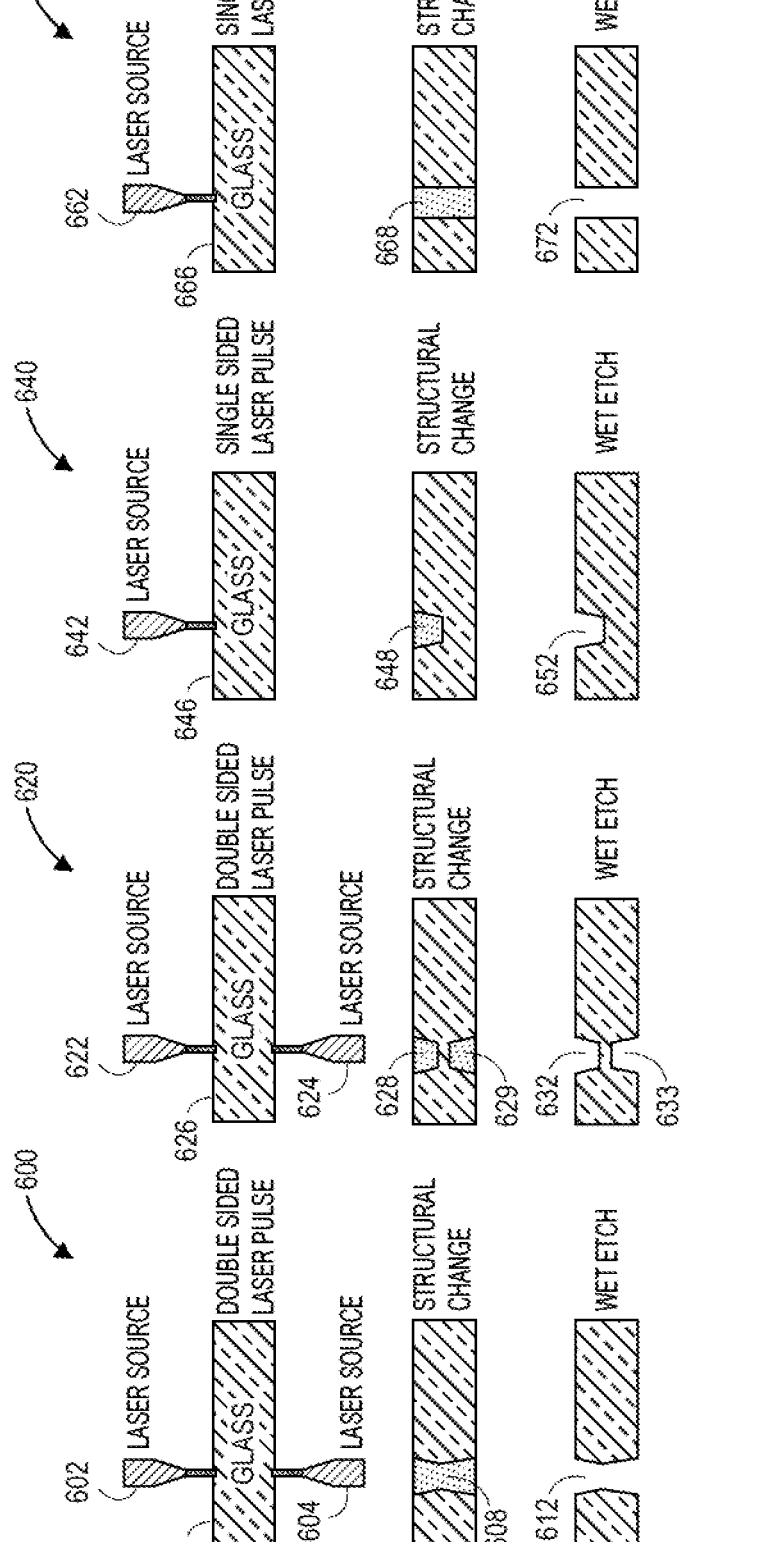
FIG. 6 illustrates multiple examples of laser-assisted etching of glass interconnects processes, in accordance with embodiments.

220, 230, 240 of FIG. 2, TGV 304 of FIG. 3A, TGV 404 of FIG. 4A, or TGV 612, 672 of FIG. 6.

At block 506, the process may further include forming a layer that includes titanium on a portion of a wall of the TGV proximate to the first side of the glass layer. In embodiments, the layer that includes titanium on a portion of a wall of the TGV proximate to the first side of the glass layer may be similar to portions of titanium layer 342a, 342b of FIG. 3E, or portions of titanium layer 442a, 442b of FIG. 4B.

At block 508, the process may further include filling the TGV with conductive material. The conductive material that fills the TGV may be similar to conductive material 224 of FIG. 2, copper 348 of FIG. 3F, or copper 448 of FIG. 4E.

FIG. 6 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 600 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 612 is created by laser pulses from two laser sources 602, 604 on opposite sides of a glass wafer 606. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 602, 604 are applied perpendicularly to the glass wafer 606 to induce a morphological change 608, which may also be referred to as a structural change, in the glass that encounters the laser pulses. This morphological change 608 includes changes in the molecular structure of the glass to make it easier to etch out (remove a portion of the glass). In embodiments, a wet etch process may be used.

Diagram 620 shows a high level process flow for a double blind shape. A double blind shape 632, 633 may be created by laser pulses from two laser sources 622, 624, which may be similar to laser sources 602, 604, that are on opposite sides of the glass wafer 626, which may be similar to glass wafer 606. In this example, adjustments may be made in the laser pulse energy and/or the laser pulse exposure time from the two laser sources 622, 624. As a result, morphological changes 628, 629 in the glass wafer 626 may result, with these changes making it easier to etch out portions of the glass. In embodiments, a wet etch process may be used.

Diagram 640 shows a high level process flow for a single-blind shape, which may also be referred to as a trench. In this example, a single laser source 642 delivers a laser pulse to the glass wafer 646 to create a morphological change 648 in the glass wafer 646. As described above, these morphological changes make it easier to etch out a portion of the glass 652. In embodiments, a wet etch process may be used.

Diagram 660 shows a high level process flow for a through via shape. In this example, a single laser source 662 applies a laser pulse to the glass wafer 666 to create a morphological change 668 in the glass wafer 666, with the change making it easier to etch out a portion of the glass 672. As shown here, the laser pulse energy and/or laser pulse exposure time from the laser source 662 has been adjusted to create an etched out portion 672 that extends entirely through the glass wafer 666.

With respect to FIG. 6, although embodiments show laser sources 602, 604, 622, 624, 642, 662 as perpendicular to a surface of the glass wafer 606, 626, 646, 666, in embodiments, the laser sources may be positioned at an angle to the surface of the glass, with pulse energy and/or pulse exposure time variations in order to cause a diagonal via or a trench, or to shape the via, such as 612, 672, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 6, through hole vias 612, 672 may be created that are less than 10 $\mu m$ in diameter, and may have an aspect ratio of 40:1 to 50:1. As a result, a far higher density of vias may be placed within the glass and be placed closer to each other at a fine pitch. In embodiments, this pitch may be 50 $\mu m$ or less. After creating the vias or trenches, a metallization process may be applied in order to create a conductive pathway through the vias or trenches, for example a plated through hole (PTH). Using these techniques, finer pitch vias may result in better signaling, allowing more I/O signals to be routed through the glass wafer and to other coupled components such as a substrate.

Figure 7:
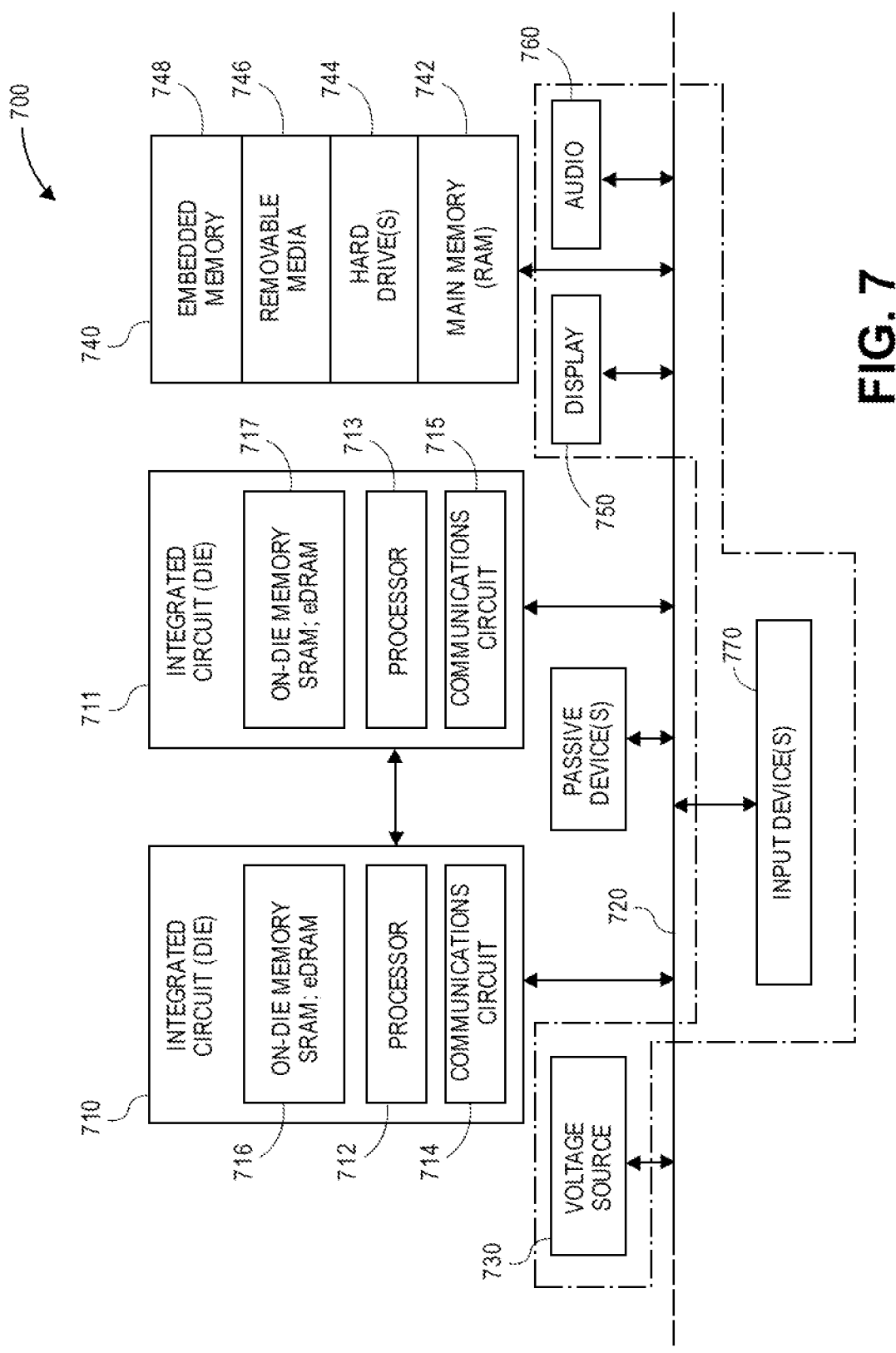
FIG. 7 schematically illustrates a computing device, in accordance with various embodiments.

FIG. 7 schematically illustrates a computing device, in accordance with various embodiments. FIG. 7 is a schematic of a computer system 700, in accordance with an embodiment of the present invention. The computer system 700 (also referred to as the electronic system 700) as depicted can embody a through glass via with a metal wall, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, a through glass via with a metal wall, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having a through glass via with a metal wall, according to any of the several disclosed embodiments and their equivalents, an electronic system, a computer system, one or more methods of fabricating an integrated circuit, and one or more methods of fabricating an electronic assembly that includes a package substrate having a through glass via with a metal wall, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a through glass via with a metal wall embodiments and their equivalents. A foundation substrate may be included, as represented by the dashed line of FIG. 7. Passive devices may also be included, as is also depicted in FIG. 7.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a glass layer with a first side and a second side opposite the first side; a through glass via (TGV) that extends from the first side of the glass layer to the second side of the glass layer; a conductive material inside the TGV to electrically couple the first side of the glass layer with the second side of the glass layer; and a layer of metal within the TGV and proximate to the first side of the glass layer between a portion of the conductive material and a wall of the TGV.

Example 2 includes the apparatus of example 1, wherein the TGV has a diameter at the first side of the glass layer, and wherein the TGV has a length from the first side of the glass layer to the second side of the glass layer; and wherein a ratio of the length of the TGV to the diameter of the TGV is greater than or equal to 8.

Example 3 includes the apparatus of example 1, wherein a shape of the TGV at the first side of the glass layer is a selected one of: a circle, an ellipse, or a rectangle.

Example 4 includes the apparatus of example 1, wherein the TGV is a plurality of TGV.

Example 5 includes the apparatus of example 4, wherein a pitch of the plurality of TGV ranges from 25 μm to 200 μm.

Example 6 includes the apparatus of example 1, wherein a thickness of the glass layer is greater than or equal to 100 μm.

Example 7 includes the apparatus of example 1, further comprising a redistribution layer (RDL) coupled with the first side of the glass layer or coupled with the second side of the glass layer, and electrically coupled with the conductive material inside the TGV.

Example 8 includes the apparatus of any one of examples 1-7, wherein the conductive material includes copper or a copper alloy, and the layer of metal includes titanium.

Example 9 is a method comprising: identifying a glass layer having a first side and a second side opposite the first side; forming a glass via (TGV) in the glass layer that extends from the first side of the glass layer to the second side of the glass layer; forming a layer that includes titanium on a portion of a wall of the TGV proximate to the first side of the glass layer; and filling the TGV with conductive material.

Example 10 includes the method of example 9, wherein forming a titanium layer on a wall of the TGV proximate to the first side of the glass layer further includes: placing a filler material within the TGV, a top of the filler material below the first side of the glass layer; depositing the layer that includes titanium on the top of the filler material and on the wall of the TGV between the top of the filler material and the first side of the glass layer; and depositing a layer of conductive material that covers the layer that includes titanium.

Example 11 includes the method of example 10, wherein depositing the layer that includes titanium further includes depositing the layer that includes titanium using sputtering.

Example 12 includes the method of example 10, wherein the conductive material is a first conductive material; and wherein filling the TGV with conductive material further includes: removing the filler material to expose a surface of the layer that includes titanium in the TGV; removing the layer that includes titanium exposing the first conductive material within the TGV; and depositing a second conductive material within a volume of the TGV between the exposed first conductive material and the second side of the glass layer, wherein the first conductive material is electrically coupled with the second conductive material.

Example 13 includes the method of example 12, wherein the first conductive material and the second conductive material include copper or a copper alloy.

Example 14 includes the method of example 12, wherein removing the filler material further includes removing the filler material using a wet etch or a dry etch process.

Example 15 includes the method of example 12, wherein moving the layer that includes titanium further includes removing the layer that includes titanium using a wet etch or a dry etch process.

Example 16 includes the method of example 9, wherein after the step of forming a layer that includes titanium on a wall of the TGV, further comprising planarizing first side of the glass layer.

Example 17 includes the method of any one of examples 9-16, wherein the TGV has a diameter at the first side of the glass layer, and wherein the TGV has a length extending from the first side of the glass layer to the second side of the glass layer; and wherein a ratio of the length of the TGV to the diameter of the TGV is greater than 8.

Example 18 is a package comprising: a glass layer that includes: a first side and a second side opposite the first side; a through glass via (TGV) that extends from the first side of the glass layer to the second side of the glass layer; a conductive material inside the TGV to electrically couple the first side of the glass layer with the second side of the glass layer; and a layer of titanium within the TGV and proximate to the first side of the glass layer between a portion of the conductive material and a side of the TGV; and one or more dies coupled with the first side of the glass layer and electrically coupled with the conductive material inside the TGV.

Example 19 includes the package of example 18, further comprising: a substrate coupled with the second side of the glass layer, the substrate electrically coupled with the one or more dies.

Example 20 includes the package of example 18, wherein the glass layer further includes a redistribution layer (RDL) on the first side of the glass layer electrically coupled with the one or more dies.

Example 21 includes the package of example 18, wherein the glass layer further includes a RDL on the second side of the glass layer electrically coupled with the substrate.

Example 22 includes the package of example 18, wherein the TGV has a diameter at the first side of the glass layer, and wherein the TGV has a length extending from the first side of the glass layer to the second side of the glass layer; and wherein a ratio of the length of the TGV to the diameter of the TGV is greater than 8.

Example 23 includes the package of example 18, wherein the TGV includes a plurality of TGVs.

Example 24 includes the package of example 23, wherein a pitch of the plurality of TGV ranges from 25 µm to 200 µm.

Example 25 includes the package of any one of examples 18-24, wherein a thickness of the glass layer is greater than or equal to 100 µm.

What is claimed is:

1. An apparatus comprising:
a glass layer with a first side and a second side opposite the first side;
a through glass via (TGV) that extends from the first side of the glass layer to the second side of the glass layer;
a conductive material inside the TGV to electrically couple the first side of the glass layer with the second side of the glass layer; and
a layer of metal within the TGV and proximate to the first side of the glass layer between a portion of the conductive material and a wall of the TGV, the layer of metal on a first portion of the TGV at the first side of the glass layer but not on the first side of the glass layer and not on a second portion of the TGV at the second side of the glass layer.

2. The apparatus of claim 1, wherein the TGV has a diameter at the first side of the glass layer, and wherein the TGV has a length from the first side of the glass layer to the second side of the glass layer; and
wherein a ratio of the length of the TGV to the diameter of the TGV is greater than or equal to 8.

3. The apparatus of claim 1, wherein a shape of the TGV at the first side of the glass layer is a selected one of: a circle, an ellipse, or a rectangle.

4. The apparatus of claim 1, wherein the TGV is a plurality of TGV.

5. The apparatus of claim 4, wherein a pitch of the plurality of TGV ranges from 25 µm to 200 µm.

6. The apparatus of claim 1, wherein a thickness of the glass layer is greater than or equal to 100 µm.

7. The apparatus of claim 1, further comprising a redistribution layer (RDL) coupled with the first side of the glass layer or coupled with the second side of the glass layer, and electrically coupled with the conductive material inside the TGV.

8. The apparatus of claim 1, wherein the conductive material includes copper or a copper alloy, and the layer of metal includes titanium.

9. A method comprising:
providing a glass layer having a first side and a second side opposite the first side;
forming a glass via (TGV) in the glass layer that extends from the first side of the glass layer to the second side of the glass layer;
forming a layer that includes titanium on a portion of a wall of the TGV proximate to the first side of the glass layer, the layer on a first portion of the TGV at the first side of the glass layer but not on the first side of the glass layer and not on a second portion of the TGV at the second side of the glass layer; and filling the TGV with conductive material.

10. The method of claim 9, wherein forming a titanium layer on a wall of the TGV proximate to the first side of the glass layer further includes:

placing a filler material within the TGV, a top of the filler material below the first side of the glass layer;

depositing the layer that includes titanium on the top of the filler material and on the wall of the TGV between the top of the filler material and the first side of the glass layer; and depositing a layer of conductive material that covers the layer that includes titanium.

11. The method of claim 10, wherein depositing the layer that includes titanium further includes depositing the layer that includes titanium using sputtering.

12. The method of claim 10, wherein the conductive material is a first conductive material; and wherein filling the TGV with conductive material further includes:

removing the filler material to expose a surface of the layer that includes titanium in the TGV;

removing the layer that includes titanium exposing the first conductive material within the TGV; and depositing a second conductive material within a volume of the TGV between the exposed first conductive material and the second side of the glass layer, wherein the first conductive material is electrically coupled with the second conductive material.

13. The method of claim 12, wherein the first conductive material and the second conductive material include copper or a copper alloy.

14. The method of claim 12, wherein removing the filler material further includes removing the filler material using a wet etch or a dry etch process.

15. The method of claim 12, wherein moving the layer that includes titanium further includes removing the layer that includes titanium using a wet etch or a dry etch process.

16. The method of claim 9, wherein after the step of forming a layer that includes titanium on a wall of the TGV, further comprising planarizing first side of the glass layer.

17. The method of claim 9, wherein the TGV has a diameter at the first side of the glass layer, and wherein the TGV has a length extending from the first side of the glass layer to the second side of the glass layer; and wherein a ratio of the length of the TGV to the diameter of the TGV is greater than 8.

18. A package comprising:

a glass layer that includes:

a first side and a second side opposite the first side;

a through glass via (TGV) that extends from the first side of the glass layer to the second side of the glass layer;

a conductive material inside the TGV to electrically couple the first side of the glass layer with the second side of the glass layer; and a layer of titanium within the TGV and proximate to the first side of the glass layer between a portion of the conductive material and a side of the TGV, the layer of titanium on a first portion of the TGV at the first side of the glass layer but not on the first side of the glass layer and not on a second portion of the TGV at the second side of the glass layer; and one or more dies coupled with the first side of the glass layer and electrically coupled with the conductive material inside the TGV.

19. The package of claim 18, further comprising:

a substrate coupled with the second side of the glass layer, the substrate electrically coupled with the one or more dies.

20. The package of claim 18, wherein the glass layer further includes a redistribution layer (RDL) on the first side of the glass layer electrically coupled with the one or more dies.

21. The package of claim 19, wherein the glass layer further includes a RDL on the second side of the glass layer electrically coupled with the substrate.

22. The package of claim 18, wherein the TGV has a diameter at the first side of the glass layer, and wherein the TGV has a length extending from the first side of the glass layer to the second side of the glass layer; and wherein a ratio of the length of the TGV to the diameter of the TGV is greater than 8.

23. The package of claim 18, wherein the TGV includes a plurality of TGVs.

24. The package of claim 23, wherein a pitch of the plurality of TGV ranges from 25 µm to 200 µm.

25. The package of claim 18, wherein a thickness of the glass layer is greater than or equal to 100 µm.

* * * * *